United States Patent
Takahashi

(10) Patent No.: US 9,674,956 B2
(45) Date of Patent: Jun. 6, 2017

(54) METHOD OF MANUFACTURING AN INTERMEDIATE PRODUCT FOR AN INTERPOSER AND INTERMEDIATE PRODUCT FOR AN INTERPOSER

(71) Applicant: Asahi Glass Company, Limited, Tokyo (JP)

(72) Inventor: Shintaro Takahashi, Tokyo (JP)

(73) Assignee: Asahi Glass Company, Limited, Tokyo (JP)

(*) Notice: Subject to any disclaimer, the term of this patent is extended or adjusted under 35 U.S.C. 154(b) by 0 days.

(21) Appl. No.: 14/631,275

(22) Filed: Feb. 25, 2015

(65) Prior Publication Data

US 2015/0173191 A1    Jun. 18, 2015

Related U.S. Application Data

(63) Continuation of application No. PCT/JP2013/070934, filed on Aug. 1, 2013.

(30) Foreign Application Priority Data

Sep. 7, 2012   (JP) .................................. 2012-197743

(51) Int. Cl.
| | |
|---|---|
| *H05K 1/03* | (2006.01) |
| *H05K 1/00* | (2006.01) |
| *H05K 1/11* | (2006.01) |
| *H01L 23/15* | (2006.01) |
| *H01L 23/498* | (2006.01) |
| *H01L 21/48* | (2006.01) |
| *H05K 3/00* | (2006.01) |
| *H05K 3/10* | (2006.01) |
| *H05K 3/42* | (2006.01) |

(52) U.S. Cl.
CPC ............. *H05K 1/115* (2013.01); *H01L 21/486* (2013.01); *H01L 23/15* (2013.01);
(Continued)

(58) Field of Classification Search
CPC ....... H05K 2201/10378; H05K 1/0306; H05K 3/10; H05K 3/42
(Continued)

(56) References Cited

U.S. PATENT DOCUMENTS

2001/0040272 A1   11/2001  Mashino
2004/0092117 A1*   5/2004  Suemasu ............... H01L 21/288
                                                          438/694
(Continued)

FOREIGN PATENT DOCUMENTS

| JP | 2001-326305 | 11/2001 |
|---|---|---|
| JP | 2006-179564 | 7/2006 |

(Continued)

OTHER PUBLICATIONS

International Search Report issued in International Application No. PCT/JP2013/070934, dated Oct. 15, 2013.

*Primary Examiner* — Sherman Ng
(74) *Attorney, Agent, or Firm* — Oblon, McClelland, Maier & Neustadt, L.L.P.

(57) ABSTRACT

A method of manufacturing an intermediate product for an interposer including a glass substrate having a plurality of through holes is provided. The method includes a step of forming a resin layer on a support substrate, and a step of forming a laminated body by adhering the glass substrate having the plurality of through holes on the resin layer. The glass substrate having the plurality of through holes has a thickness within a range of 0.05 mm to 0.3 mm.

21 Claims, 5 Drawing Sheets

(52) U.S. Cl.
CPC ....... *H01L 23/49827* (2013.01); *H05K 1/032* (2013.01); *H05K 1/0306* (2013.01); *H05K 1/11* (2013.01); *H05K 3/0094* (2013.01); *H05K 3/10* (2013.01); *H01L 2924/0002* (2013.01); *H05K 3/42* (2013.01); *H05K 2201/09563* (2013.01); *H05K 2201/10378* (2013.01); *H05K 2203/0221* (2013.01); *H05K 2203/06* (2013.01); *H05K 2203/07* (2013.01); *H05K 2203/107* (2013.01); *Y10T 156/10* (2015.01); *Y10T 156/1056* (2015.01); *Y10T 428/24331* (2015.01)

(58) Field of Classification Search
USPC .................................................. 174/255, 258
See application file for complete search history.

(56) References Cited

U.S. PATENT DOCUMENTS

| | | | | |
|---|---|---|---|---|
| 2004/0217455 | A1* | 11/2004 | Shiono | H01L 21/486 257/678 |
| 2008/0073110 | A1* | 3/2008 | Shioga | H05K 1/162 174/258 |
| 2008/0135175 | A1* | 6/2008 | Higuchi | B32B 7/06 156/718 |
| 2009/0148682 | A1* | 6/2009 | Higuchi | B32B 7/06 428/213 |
| 2009/0199957 | A1* | 8/2009 | Inao | C09J 5/04 156/154 |
| 2011/0256344 | A1 | 10/2011 | Ono et al. | |
| 2012/0156480 | A1* | 6/2012 | Kondo | B32B 7/06 428/337 |
| 2012/0171454 | A1* | 7/2012 | Kondo | B32B 17/10 428/220 |
| 2013/0027895 | A1 | 1/2013 | Hayashi | |

FOREIGN PATENT DOCUMENTS

| | | |
|---|---|---|
| JP | 2010-103406 | 5/2010 |
| JP | 2011-046174 | 3/2011 |
| JP | 2011-228495 | 11/2011 |
| JP | 2011-228511 | 11/2011 |
| WO | WO 2009/110288 A1 | 9/2009 |
| WO | WO 2010/087483 A1 | 8/2010 |
| WO | WO 2011/125546 A1 | 10/2011 |

\* cited by examiner

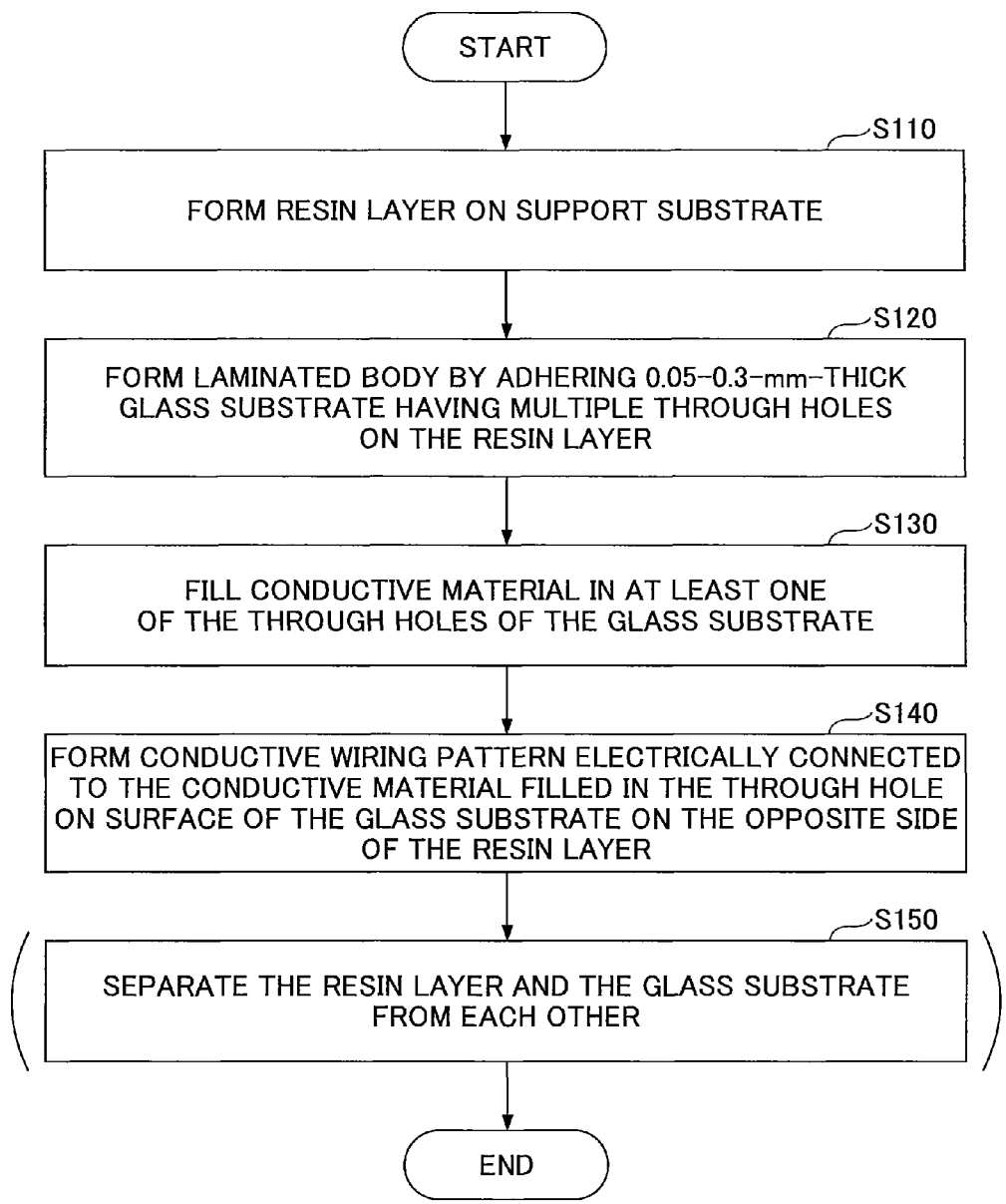

METHOD OF MANUFACTURING AN INTERMEDIATE PRODUCT FOR AN INTERPOSER AND INTERMEDIATE PRODUCT FOR AN INTERPOSER

CROSS-REFERENCE TO RELATED APPLICATION

The present application is a continuation application filed under 35 U.S.C. 111(a) claiming benefit under 35 U.S.C. 120 and 365(c) of PCT International Application No. PCT/JP2013/070934 filed on Aug. 1, 2013 and designating the U.S., which claims priority to Japanese Patent Application No. 2012-197743 filed on Sep. 7, 2012. The entire contents of the foregoing applications are incorporated herein by reference.

BACKGROUND OF THE INVENTION

1. Field of the Invention

The present invention relates to an interposer and a method of manufacturing an interposer.

2. Description of the Related Art

In view of the demands for high integration and miniaturization of semiconductor devices in recent years, efforts are being made to further develop the so-called "semiconductor three-dimensional (3D) packaging technology" which involves three-dimensionally integrating a plurality of LSI (large-scale integration) chips of a system into a single package.

In the semiconductor 3D packaging technology, elements have to be electrically interconnected three-dimensionally via fine conductive wiring patterns. However, it is difficult to form such fine wiring structures using conventional techniques such as wire bonding. Thus, in the semiconductor 3D packaging technology, a relay substrate having a plurality of via electrodes is used. Such a relay substrate is also referred to as an interposer. By using one or more relay substrates, a fine and complex three-dimensional conductive wiring pattern may be formed.

Such a relay substrate or interposer may be formed, for example, by forming a plurality of fine through holes in a glass substrate, and filling the through holes with conductive material thereafter. For example, International Publication No. WO2010/087483 discloses a technique that involves irradiating an excimer laser on a glass substrate to form a through hole.

A member for an interposer may be manufactured, for example, by irradiating an excimer laser on a glass substrate to form a through hole therein (hereinafter referred to as "glass substrate with through holes").

Typically, a glass substrate used for manufacturing an interposer is extremely thin (e.g. 0.1 mm) so that a through hole may be easily formed in the glass substrate.

When such a thin glass substrate is used to manufacture a "glass substrate with through holes," the strength of the "glass substrate with through holes" may be reduced due to the presence of through holes. For this reason, cracks and defects may be created in the "glass substrate with through holes" upon transferring the "glass substrate with through holes" for a next process and/or handling the "glass substrate with through holes" in various process steps, for example.

SUMMARY OF THE INVENTION

In view of the above, an aspect of the present invention relates to providing a method of manufacturing an intermediate product for an interposer that can reduce the risk of cracks and defects being created in a glass substrate with through holes. Another aspect of the present invention relates to providing an intermediate product for an interposer with a reduced risk of cracks and defects being formed in a glass substrate with through holes.

According to one aspect of the present invention, a method of manufacturing an intermediate product for an interposer including a glass substrate having a plurality of through holes is provided. The method includes a step of forming a resin layer on a support substrate, and a step of forming a laminated body by adhering the glass substrate having the plurality of through holes on the resin layer. The glass substrate having the plurality of through holes has a thickness within a range of 0.05 mm to 0.3 mm.

Also, in one embodiment of the method according to the present invention, the glass substrate having the plurality of through holes may be formed by irradiating laser light on a glass substrate.

In another embodiment, a maximum size of an opening of at least one of the through holes at a surface of the glass substrate on an opposite side of the resin layer may be within a range of 5 µm to 100 µm.

In another embodiment, the plurality of through holes may be formed on the glass substrate at a pitch within a range of 10 µm to 500 µm.

In another embodiment, the step of forming the resin layer may include a step of arranging a resin composition on the support substrate and solidifying the resin composition.

In another embodiment, the resin layer may have release characteristics with respect to the glass substrate.

In another embodiment, the resin layer may include at least one of a curable silicone resin and an acrylic resin that develops release characteristics upon being irradiated with ultraviolet light.

In another embodiment, the method of the present invention may include a step of filling at least one of the through holes of the glass substrate with a conductive material.

In another embodiment, the method of the present invention may include a step of forming a conductive wiring pattern on a surface of the glass substrate on an opposite side of the resin layer, the conductive wiring pattern being electrically connected to the conductive material filled in the at least one of the through holes.

In another embodiment, the method of the present invention may include a step of separating the resin layer and the glass substrate from each other.

According to another aspect of the present invention, an intermediate product for an interposer is provided that includes a glass substrate having a plurality of through holes, a support substrate, and a resin layer arranged between the support substrate and the glass substrate. The glass substrate has a thickness within a range of 0.05 mm to 0.3 mm.

Also, in one embodiment of the intermediate product according to the present invention, a maximum size of an opening of at least one of the through holes at a surface of the glass substrate on an opposite side of the resin layer may be within a range of 5 µm to 100 µm.

In another embodiment, the plurality of through holes may be formed on the glass substrate at a pitch within a range of 10 µm to 500 µm.

In another embodiment, the resin layer may have release characteristics with respect to the glass substrate.

In another embodiment, the resin layer may include at least one of a curable silicone resin and an acrylic resin that develops release characteristics upon being irradiated with ultraviolet light.

In another embodiment, the resin layer may have a thickness within a range of 1 µm to 50 µm.

In another embodiment, the plurality of through holes of the glass substrate may be filled with a conductive material.

In another embodiment, the intermediate product according to the present invention may include a conductive wiring pattern that is arranged on a surface of the glass substrate on an opposite side of the resin layer and is electrically connected to at least one of the conductive material filled in the through holes.

In another embodiment, the support substrate may have a thickness within a range of 0.3 mm to 1.1 mm.

In another embodiment, the glass substrate may have a thermal expansion coefficient within a range of $3\times10^{-6}$/K to $1\times10^{-5}$/K.

BRIEF DESCRIPTION OF THE DRAWINGS

FIG. 6 is a flowchart illustrating a method of manufacturing the third laminated body according to an embodiment of the present invention.

DESCRIPTION OF THE PREFERRED EMBODIMENTS

Figure 1:
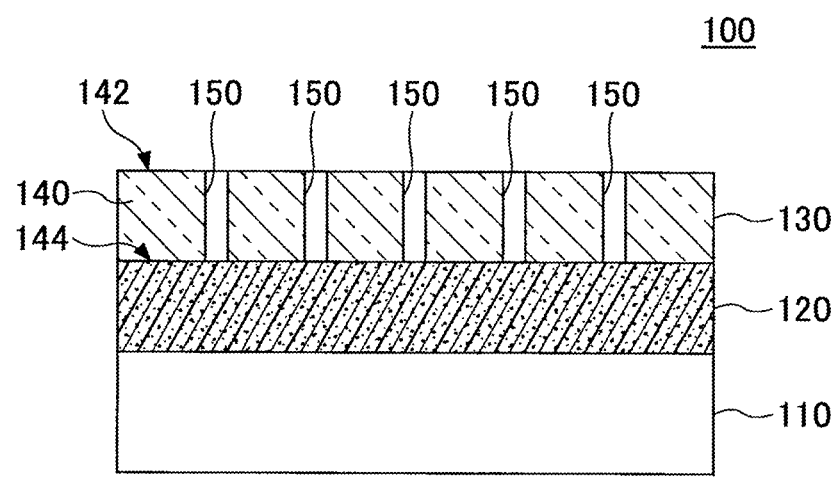
FIG. 1 is a schematic cross-sectional view of a first laminated body according to a first embodiment of the present invention.

First, terms used in the present description are defined below.

(Interposer)

In the present description, "interposer" refers to a glass substrate having a through hole that is filled with a conductive material. In the present description, an "interposer" may also be referred to as "glass substrate with via electrode".

(Glass Substrate with Through Holes)

In the present description, "glass substrate with through holes" refers to a glass substrate having a first surface and a second surface opposing each other and having at least one through hole penetrating through the first surface and the second surface.

When a conductive material is filled in a through hole of a "glass substrate with through holes", the "glass substrate with through holes" becomes a "glass substrate with via electrode", namely, an "interposer".

(Intermediate Product for an Interposer)

In the present description, an "intermediate product for an interposer" (or simply "intermediate product") collectively refers to a combination of members including a "glass substrate with through holes" and other members. For example, a laminated body including a "glass substrate with through holes," which is described in detail below, is a representative example of an "intermediate product for an interposer".

Also, in the present description, for the sake of convenience, a combination of members including a "glass substrate with via electrode", namely, an "interposer", and other members may also be referred to as "intermediate product for an interposer". In other words, a member only made up of a "glass substrate with via electrode" is referred to as "interposer", whereas a combination of members including a "glass substrate with via electrode" and one or more other members is referred to as "intermediate product for an interposer".

(Basic Concept)

In the following, a basic concept relating to the present invention is described.

According to an aspect of the present invention, a laminated body is used in a process of manufacturing an interposer, the laminated body including a glass substrate having a plurality of through holes formed thereon, a support substrate, and a resin layer that is arranged between the support substrate and the glass substrate.

As described above, when a glass substrate with through holes is manufactured using a thin glass substrate, the strength of the glass substrate with through holes is decreased due to the thinness of the glass substrate and the existence of through holes in the glass substrate. Thus, the glass substrate with through holes may be prone to cracks and defects upon being handled in various processes and/or being transferred for a next process step, for example.

In view of the above, according to an aspect of the present invention, a laminated body including a glass substrate with through holes, a resin layer, and a support substrate is used upon manufacturing an interposer.

By using such a laminated body, the strength of the glass substrate with through holes may be increased owing to the rigidity of the support substrate. Thus, by using such a laminated body, the risk of cracks and defects being created in the glass substrate with through holes upon transfer and/or handling in various processes may be reduced.

(First Laminated Body)

In the following, an intermediate product for an interposer according to an embodiment of the present invention is described with reference to the accompanying drawings. Note that in the descriptions below, a laminated body is illustrated as an example of an intermediate product for an interposer according to an embodiment of the present invention.

FIG. 1 is a schematic cross-sectional view of a first laminated body 100 according to a first embodiment of the present invention.

As illustrated in FIG. 1, the first laminated body 100 according to the first embodiment includes a support substrate 110, a resin layer 120, and a glass substrate with through holes 130 stacked in this order.

The glass substrate with through holes 130 includes a glass substrate 140 with a first surface 142 and a second surface 144 wherein a plurality of through holes 150 penetrating through the first surface 142 and the second surface 144 are formed on the glass substrate 140.

The glass substrate 140 has a thickness in the range of 0.05 mm to 0.3 mm.

The support substrate 110 has a greater rigidity than the glass substrate with through holes 130 and is capable of enhancing the strength of the first laminated body 100.

The resin layer 120 is arranged on the second surface 144 of the glass substrate 140. The resin layer 120 binds the glass substrate with through holes 130 and the support substrate 110 together.

The strength of the first laminated body 100 having the configuration as illustrated in FIG. 1 may be substantially increased as compared with the glass substrate with through holes 130 alone. Thus, by using the first laminated body 100, the risk of cracks and defects being created in the glass substrate with through holes 130 upon transfer or handling in various processes may be reduced, for example.

Note that the resin layer 120 of the first laminated body 100 preferably has "release characteristics" with respect to the glass substrate with through holes 130.

In the present description, "release characteristics" refers to characteristics of the resin layer 120 being easily separable from a member that is attached thereto (the glass substrate with through holes 130 in the present case) without leaving a part of the resin layer 120 remaining on the member.

Oftentimes, the support substrate 110 and the resin layer 120 included in the laminated body 100 are unnecessary elements of an interposer corresponding to the final product. Thus, when the laminated body 100 is used, the glass substrate with through holes 130 may desirably be separated from the resin layer 120 at their interface during a suitable process step before the interposer is provided as a final product.

In such a case, if the glass substrate with through holes 130 and the resin layer 120 are firmly bonded together, the resin layer 120 may not be properly separated from the glass substrate with through holes 130, or defects such as cracking may occur in the glass substrate with through holes 130 upon separating the resin layer 120. For example, when a part of the resin layer 120 remains on the surface of the glass substrate with through holes 130, extra work may be required to remove such residue.

However, if the resin layer 120 has release characteristics with respect to the glass substrate with through holes 130, the resin layer 120 may be properly separated from the glass substrate with through holes 130 and the above-described problem may be prevented.

Note that the resin layer 120 does not necessarily have to have such release characteristics at all times. For example, the release characteristics of the resin layer 120 may be arranged to develop right before separating the resin layer 120 from the glass substrate with through holes 130. For example, some types of acrylic resin develop release characteristics upon being irradiated with ultraviolet light. By using such acrylic resin as the resin layer 120, adequate adhesion between the glass substrate with through holes 130 and the resin layer 120 may be secured while handling the laminated body 100 under normal circumstances, and ultraviolet light may be irradiated on the resin layer 120 at a suitable stage to separate the glass substrate with through holes 130 from the laminated body 100.

Also, in the first laminated body 100 having the configuration as illustrated in FIG. 1, because the second surface 144 of the glass substrate with through holes 130 is covered by the resin layer 120, defects such as voids may be prevented from being formed in a via electrode upon performing a process step of forming the via electrode by filling the through hole 150 with conductive material, for example.

In the following, the above effect is described in greater detail with reference to FIGS. 2 and 3.

Figure 2:
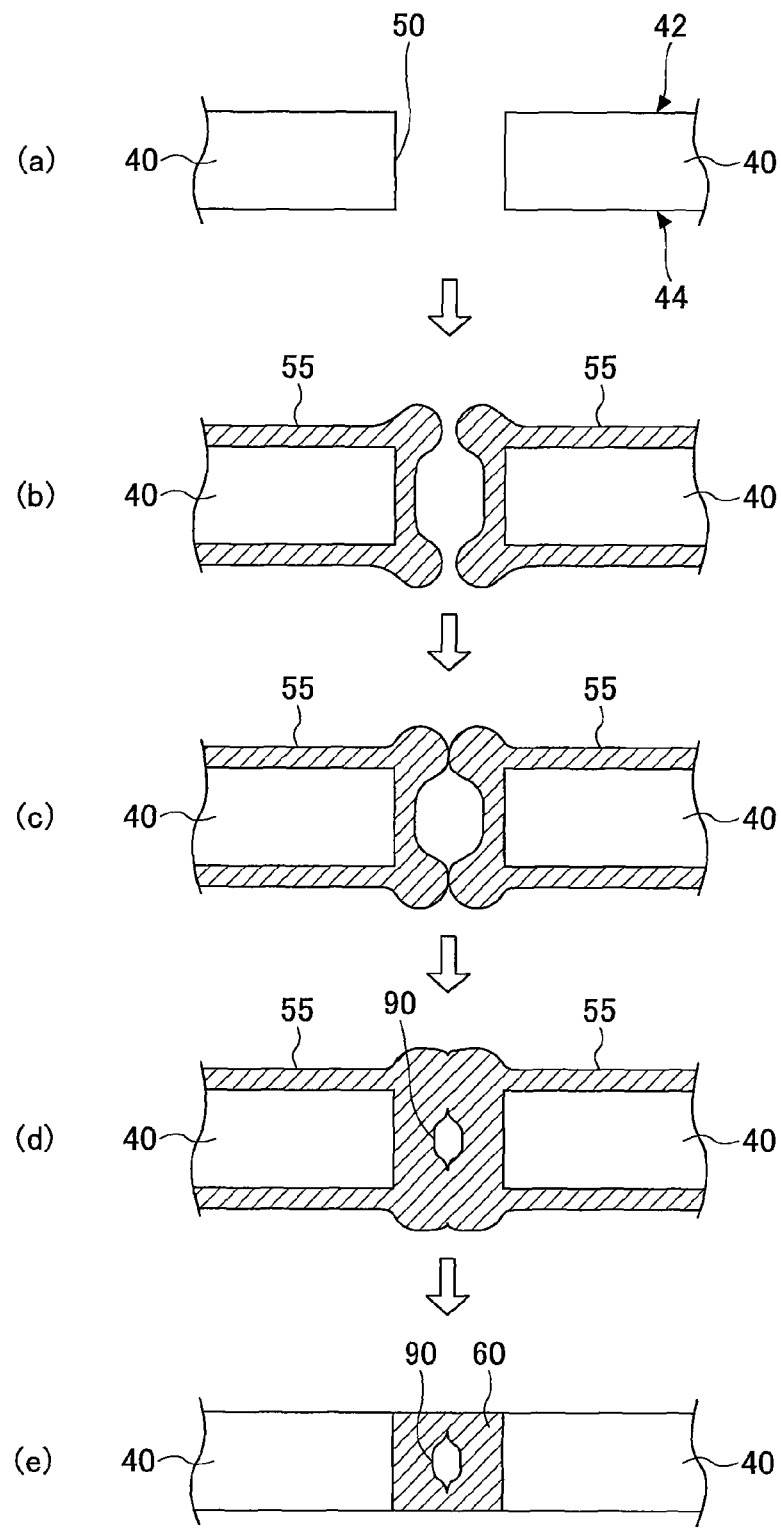
FIG. 2 illustrates conventional process steps for forming a via electrode in a through hole of a glass substrate with through holes.
Figure 3:
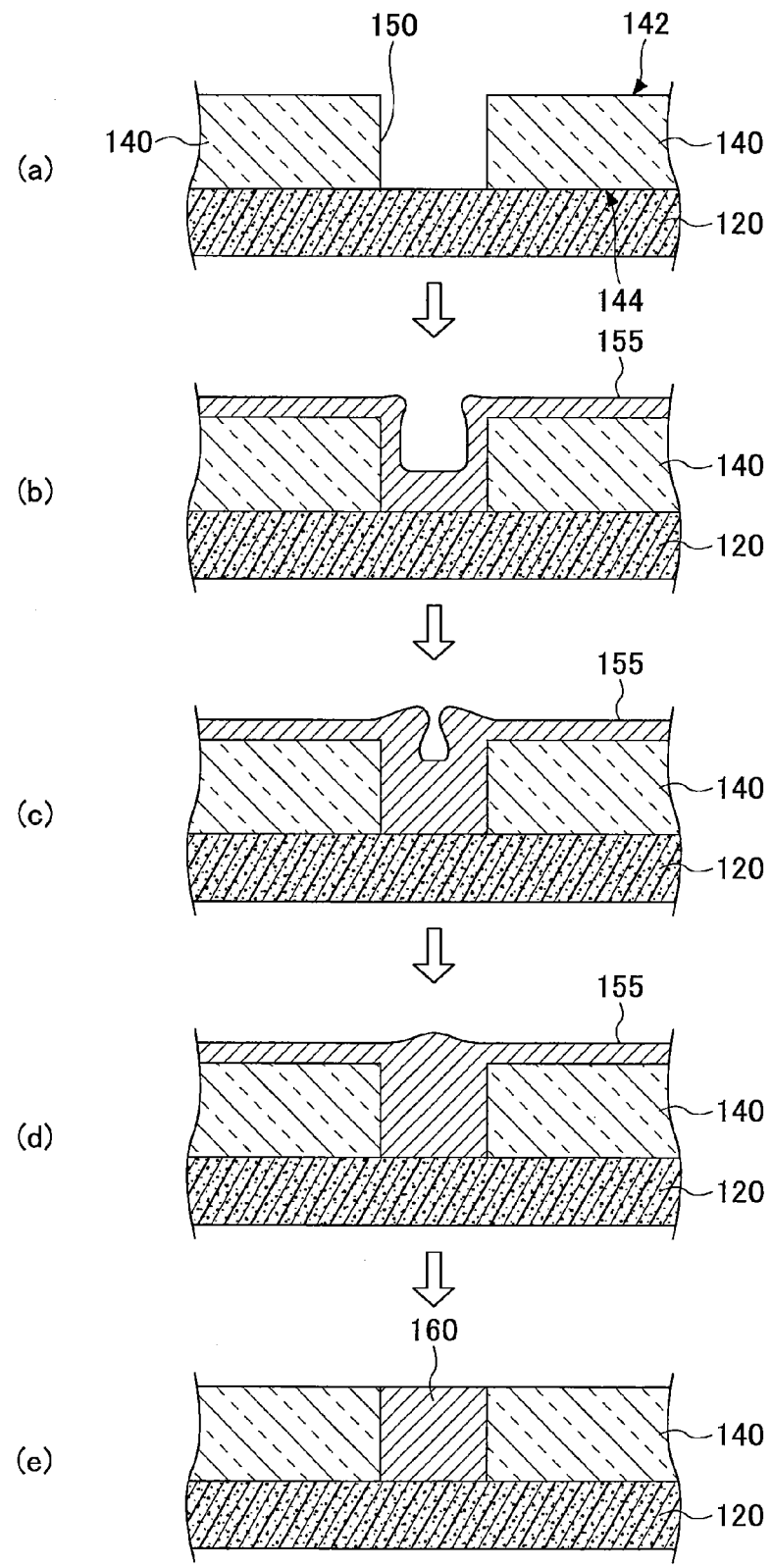
FIG. 3 illustrates process steps for forming a via electrode in a through hole of a glass substrate with through holes using a laminated body according to an embodiment of the present invention.

FIGS. 2 and 3 illustrate process steps for forming a via electrode by filling a through hole of a glass substrate with conductive material in a plating process. FIG. 2 is a cross-sectional view of conventional process steps for forming a via electrode in a glass substrate with through holes. FIG. 3 is a cross-sectional view of process steps for forming a via electrode in the glass substrate with through holes 130 using the laminated body 100 having the configuration as illustrated in FIG. 1.

As illustrated in FIG. 2, in the conventional process steps for forming a via electrode in a glass substrate with through holes, first, a glass substrate 40 having a though hole 50 is prepared (see FIG. 2 (a)).

Then, a conductive layer is arranged on a first surface 42, a second surface 44, and the through hole 150 of the glass substrate 40 in an electroless plating process (not shown).

Then, in an electrolytic plating process, a conductive material 55 is deposited on regions of the glass substrate 40 where the conductive layer has been formed. During the electrolytic plating process, an electric field tends to be concentrated around the edges of the opening of the through hole 50 due to influences of the so-called "edge effect". As a result, the conductive material 55 grows around the edges of the opening of the through hole 50 to protrude outward as illustrated in FIG. 2 (b).

As the plating process time is increased, this tendency becomes more conspicuous. That is, growth of the plating layer may be concentrated around the edges of the opening of the through hole 50 and the plating layer may hardly be grown at a side face portion of the through hole 50 (the side wall of the glass substrate 40). As a result, after a certain time elapses, the opening of the through hole 50 may be closed by the conductive material 55 at the edges of the opening of the through hole 50 even though the interior of the through hole 50 is not sufficiently filled with the conductive material 55 as illustrated in FIG. 2 (c).

In such a state, the plating solution cannot be adequately diffused within the through hole 50. As a result, after the plating process is completed, a void 90 is created within the through hole 50 as illustrated in FIG. 2 (d).

Then, as illustrated in FIG. 2 (e), the conductive material 55 adhered to the first surface 42 and the second surface 44 of the glass substrate 40 is removed to form a via electrode 60. However, the void 90 still remains in the via electrode 60 such that a uniform via electrode 60 cannot be created.

On the other hand, in the case of forming a via electrode by a plating process using the first laminated body 100 according to the first embodiment, as illustrated in FIG. 3, the resin layer 120 is arranged on the second surface 144 of the glass substrate 140.

In this way, influences of the above-described edge effect may be suppressed when a plating process is performed on the through hole 150. More specifically, as illustrated in FIG. 3 (b), the growth and outward protrusion of a conductive material 155 may be substantially suppressed at least at the second surface 144 of the glass substrate 140. Also, because influences of the edge effect are mitigated, uniform growth of the conductive material 155 within the through hole 150 may be promoted, and growth of the conductive material 155 at a side surface portion of the through hole 150 (the side wall of the glass substrate 140) may be promoted.

Further, in general, a plating layer is more easily formed on the surface of the resin layer 120 as compared to the surface of the glass substrate 140. Thus, by using the laminated body 100 including the resin layer 120 arranged on the second surface 144 of the glass substrate 140, growth of the conductive material 155 from the second surface 144 side may be promoted within the through hole 150.

When the plating process is continued, as illustrated in FIG. 3 (c) to FIG. 3 (d), the through hole 150 may be filled up with the conductive material 155 before the opening at the first surface 142 of the glass substrate 140 is closed by a portion of the conductive material 155 protruding at the edge of the opening.

Then, after the plating process is completed, and the conductive material 155 adhered to the first surface 142 and the second surface 144 of the glass substrate 140 is removed, a via electrode 160 with less voids and defects may be formed within the through hole 150 as illustrated in FIG. 3 (e).

As can be appreciated from the above, by using the laminated body 100 in the process step of forming a via electrode by filling the through hole 150 with a conductive material, defects such as voids are less likely to be created in the resulting via electrode.

(Second Laminated Body)

In the following, a laminated body according to another embodiment of the present invention is described with reference to FIG. 4.

Figure 4:
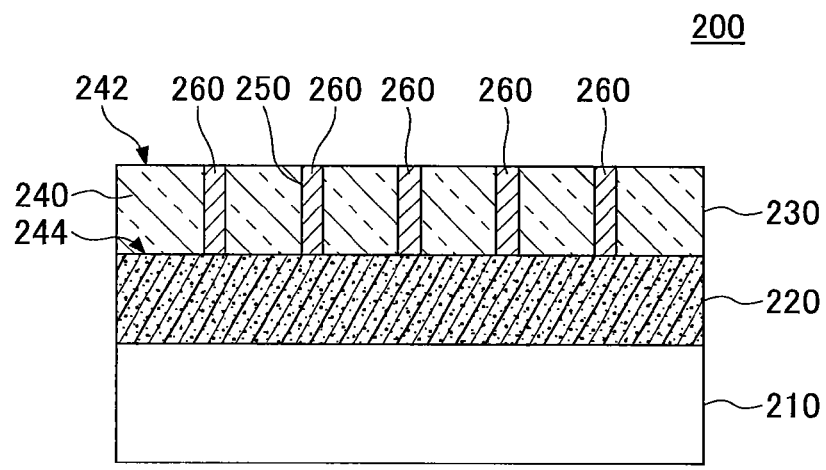
FIG. 4 is a schematic cross-sectional view of a second laminated body according to a second embodiment of the present invention.

FIG. 4 is a schematic cross-sectional view of a second laminated body 200 according to a second embodiment of the present invention.

As illustrated in FIG. 4, the second laminated body 200 has a configuration basically similar to that of the laminated body 100 as illustrated in FIG. 1. Thus, in FIG. 4, elements corresponding to those illustrated in FIG. 1 are given reference numerals equal to 100 more than the reference numerals of the corresponding elements in FIG. 1.

Note, however, that in contrast to the first laminated body 100, the second laminated body 200 includes via electrodes 260 that are formed by filling a conductive material in through holes 250 of a glass substrate with through-holes 230. Thus, the glass substrate with through-holes 230 of the laminated body 200 also constitutes a glass substrate with via electrodes 230. Note that the type of conductive material filled in the through holes 250 is not particularly limited.

In the second laminated body 200 having the above-described configuration, effects similar to those obtained in the first laminated body 100 as described above may be obtained. For example, the risk of cracks and other defects being created in the glass substrate with through-holes 230 (glass substrate with via electrodes 230) may be reduced during transfer and/or handling of the laminated body 200 in various processes.

(Third Laminated Body)

In the following, a laminated body according to another embodiment of the present invention is described with reference to FIG. 5.

Figure 5:
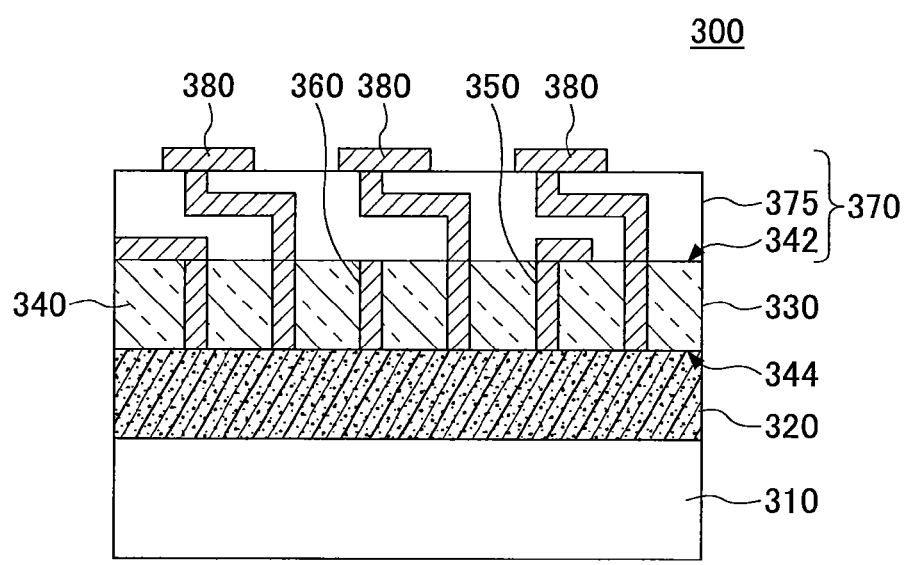
FIG. 5 is a schematic cross-sectional view of a third laminated body according to a third embodiment of the present invention.

FIG. 5 is a schematic cross-sectional view of a third laminated body according to a third embodiment of the present invention.

As illustrated in FIG. 5, the third laminated body 300 has a configuration basically similar to that of the laminated body 200 illustrated in FIG. 4. Thus, in FIG. 5, elements corresponding to those of FIG. 4 are given reference numerals that are equal to 100 more than the reference numerals of the corresponding elements in FIG. 4.

Note, however, that in contrast to the second laminated body 200, the third laminated body 300 includes a conductive wiring pattern 370 arranged on top of a glass substrate with via electrodes 330.

The conductive wiring pattern 370 includes an insulating layer 375 and a conductive wiring portion 380 formed inside and on the surface of the insulating layer 375. A part of the conductive wiring portion 380 may be electrically connected to via electrodes 360 of the glass substrate with via electrodes 330.

In the third laminated body 300 having the above-described configuration, effects substantially similar to those obtained in the first laminated body 100 and the second laminated body 200 as described above may be obtained. For example, the risk of cracks and other defects being created in the glass substrate with through-holes 330 (glass substrate with via electrodes 330) may be reduced during transfer and/or handling of the laminated body 300 in various processes.

(Component Members of Laminated Body)

In the following, component members of the laminated body are described in greater detail.

Note that although component members of the third laminated body 300 as illustrated in FIG. 5 are described as an example below, the first laminated body 100 and the second laminated body 200 may be made of similar component members.

(Support Substrate 310)

The support substrate 310 is a member for supporting the resin layer 320 and the glass substrate with through holes 330 (or glass substrate with via electrodes 330) arranged thereon. The support substrate 310 provides rigidity to the laminated body 300, and in this way, the strength of the laminated body 300 may be increased.

The material of the support substrate 310 is not particularly limited.

For example, the support substrate 310 may be made of a metal such as stainless steel or copper. Alternatively, the support substrate 310 may be made of glass such as alkali-free glass or soda lime glass, for example. Alternatively, the support substrate 310 may be made of glass epoxy resin or plastic (synthetic resin), for example. Examples of plastic materials include, but are not limited to, polyethylene terephthalate resin, polycarbonate resin, polyimide resin, fluorine resin, polyamide resin, aromatic polyamide resin, polyamide-imide resin, polyether sulfone resin, polyether ketone resin, polyether ketone ketone resin, polyether ether ketone resin, polyethylene naphthalate resin, polyacrylic resin, various liquid crystal polymer resins, and silicone resin.

Note that when a heating process has to be performed on the laminated body 300 in the interposer manufacturing process, the support substrate 310 preferably has heat resistance.

The thickness of the support substrate 310 is not particularly limited but may be in the range of 0.3 mm to 1.1 mm, for example. Note that if the thickness of the supporting substrate 310 is too thin, the support substrate 310 may be unable to provide adequate rigidity to the laminated body 300.

(Resin Layer 320)

The resin layer 320 binds together the support substrate 310 and the glass substrate with through holes 330.

The resin layer 320 may be made of curable silicone resin and/or acrylic resin, for example, but is not limited thereto.

As described above, the resin layer 320 preferably has release characteristics with respect to the glass substrate with through holes 330. In this way, the portion of the laminated body 300 including the glass substrate with through holes 330 and the conductive wiring pattern 370 may be easily separated from the portion of the laminated body 300 including the resin layer 320 and the support substrate 310 at a suitable stage.

An example of a resin composition having such release characteristics includes the resin composition disclosed in Japanese Laid-Open Patent Publication No. 2011-46174 (curable silicone resin composition including organo alkenyl polysiloxane and organohydrogen polysiloxane having a hydrogen atom bonded to a molecular end of a silicon atom). Also, some types of acrylic resin develop release characteristics upon being irradiated with ultraviolet light.

Note that the adhesion between the support substrate 310 and the resin layer 320 is preferably greater than the adhesion between the resin layer 320 and the glass substrate with through holes 330. In this way, the resin layer 320 may be prevented from being separated from the support substrate 310 at their interface upon separating the resin layer 320 from the glass substrate with through holes 330. Thus, the portion of the laminated body 300 including the glass substrate with through holes 330 and the conductive wiring pattern 370 may be separated from the portion of the laminated body 300 including the resin layer 320 and the support substrate 310.

The thickness of the resin layer 320 is not particularly limited. For example, the thickness of the resin layer 320 may be in the range of 1 μm to 50 μm.

(Glass Substrate with Through Holes 330)

The glass substrate 340 for the glass substrate with through-holes 330 may be made of any type of glass such as soda lime glass or alkali-free glass, for example.

However, assuming through holes are to be formed in the glass substrate 340 through laser processing, the thermal expansion coefficient of the glass substrate 340 is preferably in the range of $3\times10^{-6}$/K to $1\times10^{-5}$/K. In this way, the glass substrate 340 may be substantially prevented from chipping and/or cracking when laser processing is performed thereon.

The glass substrate with through holes 330 has a thickness in the range of 0.05 mm to 0.3 mm.

The through holes 350 may be formed in the glass substrate 340 in any number, size, shape, and pitch.

For example, the shape of the through holes 350 may be substantially cylindrical, substantially elliptical, or have a substantially prismatic shape. Also, the through holes 350 may be tapered from the first surface 342 toward the second surface 344 of the glass substrate 340.

Also, the maximum size of the through holes 350 at the first surface 342 or the second surface 344 of the glass substrate 340 (i.e. opening portions) may be in the range of 5 μm to 100 μm, for example. Note that the above maximum size may refer to the diameter or the long diameter of the openings of the through holes 350 in the case where the through holes 350 are substantially cylindrical or substantially elliptical.

Also, the through holes 350 may be arranged at a pitch of 10 μm to 500 μm in the glass substrate 340, for example.

(Via Electrode 360)

The material of the via electrodes 360 formed in the through holes 350 is not particularly limited as long as it is a conductive material. For example, the via electrodes 360 may be made of zinc, a zinc alloy, nickel, a nickel alloy, copper, or a copper alloy. As described below, the via electrodes 360 may be formed in the through holes 350 by a plating process.

(Conductive Wiring Pattern 370)

The conductive wiring pattern 370 is arranged on top of the first surface 342 of the glass substrate 340.

For example, the conductive wiring pattern 370 may include an insulating layer 375 and a conductive wiring portion 380 formed inside and on the surface of the insulating layer 375.

The insulating layer 375 may be made of resin, for example, but is not limited thereto. The conductive wiring portion 380 may be made of a conductive metal material such as copper, for example. At least a part of the conductive wiring portion 380 may be electrically connected to the via electrodes 360 of the glass substrate with via electrodes 330.

(Method of Manufacturing Laminated Body)

In the following a method of manufacturing a laminated body according to another embodiment of the present invention is described with reference to the drawings.

Note that a method of manufacturing the third laminated body 300 as illustrated in FIG. 5 is described below as an illustrative example. Accordingly, reference numerals indicated in FIG. 5 are used below. However, note that similar process steps may be implemented to manufacture the first laminated body 100 and the second laminated body 200.

FIG. 6 is a flowchart illustrating process steps of a method of manufacturing a laminated body according to an embodiment of the present invention.

As illustrated in FIG. 6, the method of manufacturing a laminated body according to the present embodiment includes:

a step of forming a resin layer on a support substrate (step S110);

a step of adhering a glass substrate having a plurality of holes and having a thickness of 0.05 mm to 0.3 mm on the resin layer to form a laminated body (step S120);

a step of filling at least one of the through holes of the glass substrate with a conductive material (step S130); and a step of forming, on a surface of the glass substrate on the opposite side of the resin layer, a conductive wiring pattern that is electrically connected to the conductive material filled in the through hole (step S140).

In a method of manufacturing a laminated body according to another embodiment, if necessary or desired, the method may further include:

a step of separating the resin layer and the glass substrate from each other (step S150).

Note that a glass substrate with via electrodes having a conductive material filled in its through holes may have a greater strength than a glass substrate with through holes that does not have the conductive material filled therein. Accordingly, in some cases, the glass substrate with via electrodes may not be susceptible to cracking and defects even when the glass substrate with via electrodes is transferred alone or handled alone in various process steps, for example. In such a case, the execution order of step S140 and step S150 may be reverse, for example.

In the following, the above process steps are described in greater detail.

(Step S110)

First, the resin layer 320 is formed on the support substrate 310.

Note that the method of forming the resin layer 320 on the support substrate 310 is not particularly limited. For example, the resin layer 320 may be formed by arranging a liquid or non-liquid resin composition on the support substrate 310 and solidifying the resin composition.

The resin composition may contain an organic solvent as is necessary or desired.

Exemplary methods for arranging the resin composition on the support substrate 310 include spray coating, die coating, spin coating, dip coating, roll coating, bar coating, screen printing, and gravure coating.

Note that the method for solidifying the resin composition is not particularly limited. For example, the resin composition may be solidified by a heating process and/or an ultraviolet light irradiation process.

For example, in a case where a curable silicone resin is used as the resin layer 320, the above-described resin composition (curable silicone resin composition including organo alkenyl polysiloxane and organohydrogen polysiloxane having a hydrogen atom bonded to a molecular end of a silicon atom) may be coated on the support substrate 310 after which the resin composition may be maintained in the atmosphere under a temperature of 50° C. to 300° C. to solidify the resin composition.

Note that the adhesion between the support substrate 310 and the resin layer 320 is preferably arranged to be relatively high such that when separating the glass substrate with through holes 330 from the laminated body 300 in a subsequent step (step S150), the support substrate 310 and the resin layer 320 may be prevented from separating at their interface.

Accordingly, in some embodiments, before arranging the resin composition on the support substrate 310, a surface modification process may be performed on the surface of the support substrate 310. Examples of the surface modification process include a chemical process such as a primer process for improving chemical bonding using a silane coupling agent, for example, a physical process such as a flame treatment for increasing the surface active group, and an a mechanical process such as sandblasting for increasing the roughness of the surface to promote the development of the wedge effect, for example.

Also, as described above, the resin layer 320 is preferably arranged to have release characteristics at its interface with the glass substrate with through holes 330 to be arranged in a subsequent step (step S120). In this way, in the step of separating the glass substrate with through holes 330 of the laminated body 300 (step S150), the glass substrate with through holes 330 and the resin layer 320 may be easily separated from each other at their interface.

(Step S120)

Then, the glass substrate with through holes 330 is arranged on the resin layer 320 that has been formed in step S110, and the laminated body 300 is formed.

The glass substrate with through holes 330 is prepared by forming a plurality of through holes 350 in the glass substrate 340.

The method for forming the through holes 350 is not particularly limited. For example, the through holes 350 may be formed in the glass substrate 340 by irradiating laser light such as an excimer laser having a suitable energy on the glass substrate 340. Alternatively, the through holes 350 may be formed by a laser-guided discharge process, for example.

As described above, the number, size, shape, and pitch of the through holes 350 are not particularly limited. For example, the shape of the through holes 350 may be substantially cylindrical, substantially elliptical, or may have a substantially prismatic shape. Also, the through holes 350 may be tapered from the first surface 342 toward the second surface 344 of the glass substrate 340.

The method of bonding the glass substrate with through holes 330 to the resin layer 320 is not particularly limited. For example, after arranging the glass substrate with through holes 330 on the resin layer 320, the two members may be pressure bonded using a roll or a press, for example. Alternatively, after arranging the glass substrate with through holes 330 on the resin layer 320, the members may be placed in a pressure chamber and bonded together by a non-contact bonding process, for example. Note that other various processes may be used to bond the glass substrate with through holes 330 and the resin layer 320.

By performing the above steps, a laminated body including the support substrate 310, the resin layer 320, and the glass substrate with through holes 330 may be formed.

For example, the first laminated body 100 as illustrated in FIG. 1 may be manufactured by the above steps.

(Step S130)

In the case of manufacturing the third laminated body 300 (and the second laminated body 200), at least one through hole 350 of the glass substrate with through holes 330 is filled with a conductive material to form a via electrode 360.

Note that the type of conductive material used in the via electrode 360 is not particularly limited. For example, the conductive material may be nickel, a nickel alloy, copper, a copper alloy, zinc, or a zinc alloy.

Also, the method of forming the via electrode 360 is not particularly limited.

For example, the via electrode 360 may be formed by filling the through hole 350 with a conductive material in a plating process.

For example, in a case where copper is used as the conductive material and the through hole 350 is filled with copper in a plating process, the following process steps may be implemented.

(First Process)

First, a copper electroless plating process is performed to form an electroless copper plating film on the first surface 342 of the glass substrate 340 and the side wall of the through hole 350.

(Second Process)

Then, a copper electrolytic plating process is performed to form a copper electroplating layer on the copper electroless plating film formed in the first process.

In this way, the through hole 350 may be filled with copper and the via electrode 360 may be formed.

Note that in a laminated body according to an embodiment of the present invention, the second surface 344 of the glass substrate with through holes 330 is covered by the resin layer 320. Thus, as described above, influences of the edge effect may be mitigated upon forming the via electrode 360 by a plating process, and the via electrode 360 may be formed with less voids and defects (see FIG. 3).

(Step S140)

Then, a desired conductive wiring pattern 370 is formed on the glass substrate with through holes 330.

The method of forming the conductive wiring pattern 370 is not particularly limited, and various conventional methods may be used. For example, the conductive wiring pattern 370 may be formed by patterning an insulating layer on top of the glass substrate with through holes 330 via a mask and depositing a conductive material at desired positions thereafter. In another example, the conductive wiring pattern 370 may be formed by repeatedly performing the processes of depositing and partially etching an insulating film and depositing and partially etching a conductive material, for example, to form the conductive wiring portion 380 inside and/or on the surface of the insulating layer 375.

By performing the above steps, the third laminated body 300 as illustrated in FIG. 5 may be manufactured.

(Step S150)

Then, if necessary or desired, the glass substrate with through holes 330 and the resin layer 320 may be separated from each other at their interface.

In this way, an intermediate product for an interposer including the glass substrate with through holes 330 and the conductive wiring pattern 370 formed thereon may be manufactured.

The above-described method of manufacturing a laminated body does not include a step of transferring or handling the relatively fragile glass substrate with through holes 330 alone. Accordingly, the risk of cracks and defects being created in the glass substrate may be reduced in manufacturing a laminated body or an intermediate product for an interposer that is ultimately obtained, for example.

Aspects of the present invention may be applied, for example, to an interposer that may be used in semiconductor 3D packaging technology.

Although the present invention has been described above with respect to illustrative embodiments, the present invention is not limited to these embodiments and various variations and modifications may be made without departing from the scope of the present invention.

What is claimed is:

1. A method of manufacturing an intermediate product for an interposer, the method comprising:
   forming a resin layer on a support substrate comprising glass or a metal; and
   adhering a glass substrate having a plurality of through holes on the resin layer,
   wherein the glass substrate has a thickness of from 0.05 mm to 0.3 mm.

2. The method according to claim 1, wherein the through holes are formed by irradiating laser light on a glass substrate.

3. The method according to claim 1, wherein a maximum size of an opening of at least one of the through holes at a surface of the glass substrate on an opposite side of the resin layer is of from 5 µm to 100 µm.

4. The method according to claim 1, wherein the through holes are formed on the glass substrate at a pitch of from 10 µm to 500 µm.

5. The method according to claim 1, wherein the forming of the resin layer comprises applying a resin composition on the support substrate and solidifying the resin composition.

6. The method according to claim 1, wherein the resin layer has release characteristics with respect to the glass substrate.

7. The method according to claim 1, wherein the resin layer comprises at least one of a curable silicone resin and an acrylic resin that develops release characteristics upon irradiation with ultraviolet light.

8. The method according to claim 1, further comprising:
   filling at least one of the through holes of the glass substrate with a conductive material after the adhering of the glass substrate on the resin layer.

9. The method according to claim 8, further comprising:
   forming a conductive wiring pattern on a surface of the glass substrate on an opposite side of the resin layer,
   wherein the conductive wiring pattern is electrically connected to the conductive material filled in the at least one of the through holes.

10. The method according to claim 8, further comprising:
    separating the resin layer and the glass substrate from each other.

11. The method according to claim 1, wherein the interposer is the glass substrate having the through holes.
    separating the resin layer and the glass substrate from each other.

12. An intermediate product for an interposer, comprising:
    a glass substrate having a plurality of through holes;
    a support substrate comprising glass or a metal; and
    a resin layer formed between the support substrate and the glass substrate,
    wherein the glass substrate has a thickness of from 0.05 mm to 0.3 mm.

13. The intermediate product according to claim 12, wherein a maximum size of an opening of at least one of the through holes at a surface of the glass substrate on an opposite side of the resin layer is of from 5 µm to 100 µm.

14. The intermediate product according to claim 12, wherein the through holes are formed on the glass substrate at a pitch of from 10 µm to 500 µm.

15. The intermediate product according to claim 12, wherein the resin layer has release characteristics with respect to the glass substrate.

16. The intermediate product according to claim 12, wherein the resin layer includes at least one of a curable silicone resin and an acrylic resin that develops release characteristics upon being irradiated with ultraviolet light.

17. The intermediate product according to claim 12, wherein the resin layer has a thickness of from 1 µm to 50 µm.

18. The intermediate product according to claim 12, wherein the through holes of the glass substrate are filled with a conductive material.

19. The intermediate product according to claim 18, further comprising:
    a conductive wiring pattern formed on a surface of the glass substrate on an opposite side of the resin layer and is electrically connected to the conductive material filled in at least one of the through holes.

20. The intermediate product according to claim 12, wherein the support substrate has a thickness of from 0.3 mm to 1.1 mm.

21. The intermediate product according to claim 12, wherein the glass substrate has a thermal expansion coefficient of from $3\times10^{-6}$/K to $1\times10^{-5}$K.

* * * * *